United States Patent [19] [11] Patent Number: 4,990,917
Kohdaka [45] Date of Patent: Feb. 5, 1991

[54] PARALLEL ANALOG-TO-DIGITAL CONVERTER

[75] Inventor: Takayuki Kohdaka, Hamamatsu, Japan

[73] Assignee: Yamaha Corporation, Hamatsu, Japan

[21] Appl. No.: 319,621

[22] Filed: Mar. 7, 1989

[30] Foreign Application Priority Data

Mar. 8, 1988 [JP] Japan ................................ 63-54046

[51] Int. Cl.$^5$ .............................................. H03M 1/36
[52] U.S. Cl. ..................................... 341/159; 341/138
[58] Field of Search ................. 341/127, 138, 139, 159

[56] References Cited

U.S. PATENT DOCUMENTS 3,688,221  8/1972  Fruhalf ................................. 341/138
3,735,264  5/1973  Mauduech ........................... 341/138
3,736,586  5/1973  Donjon ................................ 341/138

Primary Examiner—William M. Shoop, Jr.
Assistant Examiner—Marc S. Hoff
Attorney, Agent, or Firm—Burns, Doane, Swecker & Mathis

[57] ABSTRACT

A parallel analog-to-digital converter having reference-voltage generating means dividing the fundamental reference voltage into exponential reference voltages according to an exponential scale, and further dividing each voltage between two consecutive exponential reference voltages into a plurality of individual reference voltages. As a result, the individual reference voltages have a nonlinear (exponential) characteristic that as the amplitude of an analog input voltage increases, the increment of the individual reference voltages becomes larger exponentially, thus greatly reducing the number of comparators.

1 Claim, 1 Drawing Sheet

PARALLEL ANALOG-TO-DIGITAL CONVERTER

BACKGROUND OF THE INVENTION

1. Field of the Invention

The present invention relates to a parallel analog-to-digital converter (ADC) preferably used in image-display processors that require high-speed conversion. More specifically, the invention relates to a parallel ADC that can greatly reduce the number of comparators required.

2. Prior Art

A conventional, high-speed, n-bit parallel ADC is configured as shown in FIG. 1. In FIG. 1, numeral 2 designates a reference-voltage-generating circuit having a plurality of resistors connected serially. Four resistors 4, one at the far left, one at the far right, and two at the center are of $R/2$ $\Omega$, and the other resistors 6 are of $R$ $\Omega$. To end terminals Ta and Tb of reference-voltage-generating circuit 2 are applied positive reference voltage $V_{RH}$ and negative reference voltage $V_{RL}$, respectively (these reference voltages are called fundamental reference voltages in contrast to individual reference voltages mentioned below). In addition, to center terminal Tc is applied center voltage $V_{RM}$ which has a voltage between the positive reference voltage $V_{RH}$ and the negative reference voltage $V_{RL}$, e.g., 0 volt.

The voltage between terminals Ta and Tb of reference-voltage-generating circuit 2 is equally divided into $2^n$ levels by resistors 4 and 6. Consequently, individual-reference-voltage nodes P1 to Pk ($k=2^n-1$) presents individual reference voltages V1 to Vk. Any two consecutive voltages of these nodes are of a constant difference. Each of these reference voltages V1 to Vk is applied to one input of each of the comparators C1 to Ck, respectively. To the other input of each comparator thereof, analog input voltage $V_{in}$ to be converted is simultaneously applied through input terminal $T_{in}$, respectively. Hence, each comparator simultaneously compares analog input voltage $V_{in}$ with individual reference voltages V1 to Vk, and supplies the result of the comparisons to encoder 8. Encoder 8 converts the k-bit comparator outputs into an n-bit binary code. Thus, analog input voltage $V_{in}$ applied to input terminal $T_{in}$ is converted into n-bit digital data at a very high speed, and the digital data is produced from output terminal $T_{out}$.

The conventional n-bit parallel ADC described above, however, necessitates $2^n-1$ ($=k$; the same number as that of individual reference voltages V1 to Vk) comparators because the reference voltages V1 to Vk are generated by equally dividing the voltage between positive reference voltage $V_{RH}$ and negative reference voltage $V_{RL}$ into $2^n$. For this reason, a great number of high-precision comparators are required for an increasing number of bits of digital output data. In addition, the larger the number of bits, the more complex encoder 8 must be. These factors hinder the production of low-cost, high-density integrated circuits of the ADC.

SUMMARY OF THE INVENTION

It is therefore an object of the invention to provide a parallel ADC that can greatly reduce the required number of comparators, thus achieving a small-scale ADC while increasing the number of bits thereof.

Another object of the invention is to provide a parallel ADC of low cost and with a high density of integrated circuits.

It is a further object of the invention to provide a parallel ADC, preferably applied to image-display processors that handle video signals relating to human perception, which is subject to the Weber-Fechner Law, which says that sensory intensity is proportional to the logarithm of stimulus intensity.

According to one aspect of the present invention, there is provided a parallel analog-to-digital converter comprising:

reference-voltage-generating means for generating a plurality of individual reference voltages;

a plurality of comparator means for comparing each of the individual reference voltages with an analog input voltage; and encoding means for encoding outputs of the comparator means into digital data corresponding to the analog input;

whereby the reference-voltage-generating means divides fundamental reference voltage into exponential reference voltages according to an exponential scale, and further divides each voltage between two consecutive exponential reference voltages into a plurality of the individual reference voltages.

DESCRIPTION OF THE PREFERRED EMBODIMENT

The invention will now be described with reference to the accompanying drawings.

Figure 1:
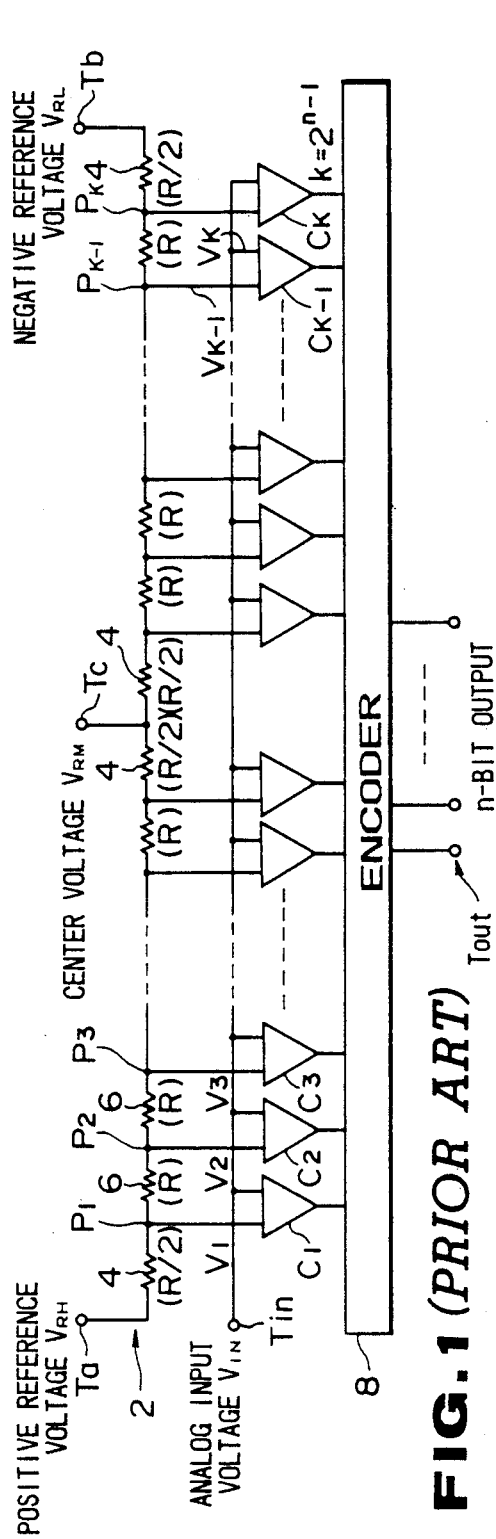
FIG. 1 is a block diagram showing the configuration of a conventional parallel ADC.
Figure 2:
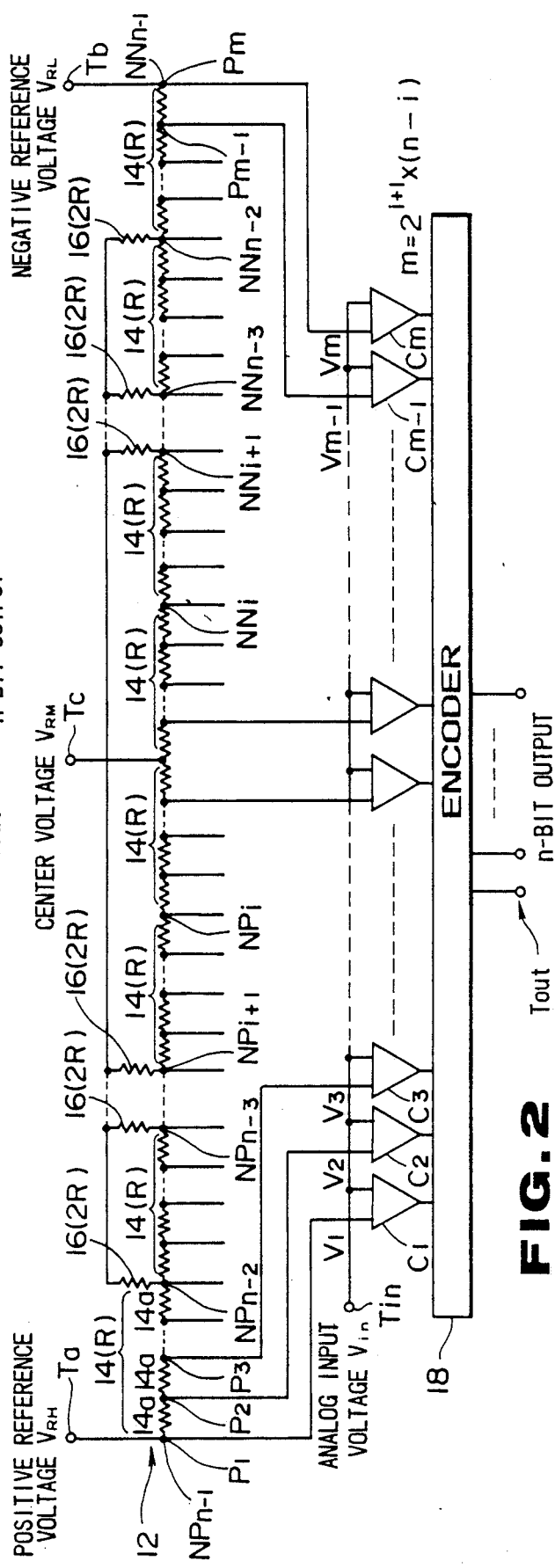
FIG. 2 is a block diagram showing the configuration of a parallel ADC according to an embodiment of the present invention.

FIG. 2 is a configuration of a parallel ADC according to an embodiment of the present invention.

In FIG. 2, numeral 12 designates a reference-voltage-generating circuit which is made up of an R-2R resistor ladder network. The R-2R resistor ladder network, as is well-known, consists of a combination of R-$\Omega$ resistors 14, and 2R-$\Omega$ resistors 16. There are (n-i) resistors 14 which are connected serially across positive reference voltage $V_{RH}$ and center voltage $V_{RM}$, and other (n-i) resistors 14 connected across negative reference voltage $V_{RL}$ and central voltage $V_{RM}$, where n is the number of bits of ADC, and i is an integer appropriately selected. Each connecting point of resistors 14 (called an exponential node hereafter) which is positive is designated by NPi, NPi+1, ..., NPn-2, NPn-1 ($=V_{RH}$); and each exponential node which is negative is denoted as NNi, NNi+1, ..., NNn-2, NNn-1 ($=V_{RL}$). Each exponential node NPi+1 to NPn-2 and NNi+1 to NNn-2 is connected to center terminal Tc through 2R-$\Omega$ resistor 16.

The R-2R resistor ladder network 12 thus configured, as is well-known, generates individual reference voltages according to an exponential scale (these individual reference voltages are called exponential reference voltages hereafter): exponential reference voltage $V_{RH}$ is produced from exponential node NPn-1; exponential reference voltage $V_{RH}/2$ is produced from exponential node NPn-2; exponential reference voltage $V_{RH}/2^2$, from node NPn-3; ...; exponential reference voltage $V_{RH}/2^{(n-i-2)}$, from node NPi+1; exponential reference voltage $V_{RH}/2^{(n-i-1)}$, from node NPi. In a similar manner, each negative exponential reference voltage $V_{RL}$, $V_{RL}/2$, $V_{RL}/2^2$, . . ., $V_{RL}/2^{(n-i-2)}$, and $V_{RL}/2^{(n-i-1)}$ is produced from each exponential node NNn−1, NNn−2, NNn−3, . . ., NNi+1, and NNi.

Each resistor 14 placed between two consecutive exponential nodes consists of $2^i$ resistors 14a of equal value. As a result, between two consecutive exponential nodes, there are provided $2^i$ individual nodes (including one of the two exponential nodes) at an equal interval. Thus, m ($=2^{i+1}\times(n-i)$) individual nodes P1, P2, P3, . . ., Pm−1, Pm, including exponential nodes, are formed between terminals Ta and Tb, generating individual reference voltages V1 to Vm. Each individual reference voltage Vj (j=1 to m) is applied to one input terminal of comparator Cj, and is compared with analog input voltage Vi simultaneously applied to the other input terminal thereof via input terminal Tin. These comparisons are performed simultaneously by all the comparators C1 to Cm, and the results of the comparisons are applied to encoder 18. Encoder 18 converts the m-bit input data into a n-bit binary code. Thus, analog input voltage $V_{in}$ supplied via input terminal $T_{in}$, is converted into n-bit digital data, and produced from n-bit output terminal $T_{out}$. A more specific case will now be described using an example of 9-bit ADC (n=9). When integer i is specified as i=4, the number of positive exponential nodes NPi to NPn−1 is 5 (=n−i), which is the same number a that of the negative exponential nodes NNi to NNn−1. Additionally, between two consecutive exponential nodes, there are 16(=$2^i$) nodes, and so the total number of nodes is 160(=16×10).

In this case, positive exponential reference voltages are $V_{RH}$, $V_{RH}/2$, $V_{RH}/4$, $V_{RH}/8$, $V_{RH}/16$; and negative exponential reference voltages are $V_{RL}$, $V_{RL}/2$, $V_{RL}/4$, $V_{RL}/8$, $V_{RL}/16$. Furthermore, each voltage across each resistor 14, i.e., each voltage between two consecutive exponential reference voltages (for example, a voltage between $V_{RH}$ and $V_{RH}/2$, or between $V_{RH}/2$ and $V_{RH}/4$, etc.) is divided into 16 equal parts, producing 160 individual reference voltages.

In a similar manner, when n=9 bits and i=5, the number of exponential nodes is 8 (=2×(n−i)), and the number of nodes between two consecutive exponential nodes is 32 (=$2^i$), and so the total number m of comparators is 256 (=8×32). Moreover, when n =9 and i=6, the total number of comparators is 384 (=6×64).

In contrast, a conventional 9-bit ADC requires 511 comparators, since $2^9-1=511$. Thus, ADC according to the present invention can greatly reduce the number of comparators.

Although a specific embodiment of a parallel analog-to-digital converter constructed in accordance with the present invention has been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A parallel analog-to-digital converter comprising:
   (a) reference-voltage generating means for generating a plurality of individual reference voltages, wherein said reference voltage generating means comprises a resistor ladder network that is made up of first resistors of predetermined value and second resistors having values which are multiples of said predetermined value, wherein each of said first resistors comprises a plurality of resistors of the same value connected serially, each connecting point of said resistors of the same value producing said individual reference voltage;
   (b) a plurality of comparator means for comparing each of said individual reference voltages with an analog input voltage; and
   (c) encoding means for encoding outputs of said comparator means into digital data corresponding to said analog input,
       whereby said reference-voltage generating means divides a fundamental reference voltage into exponential reference voltages according to an exponential scale, and further divides each voltage between two consecutive exponential reference voltages into a plurality of said individual reference voltages.

* * * * *